United States Patent [19]
Fazan et al.

[11] Patent Number: 5,637,523
[45] Date of Patent: Jun. 10, 1997

[54] METHOD OF FORMING A CAPACITOR AND A CAPACITOR CONSTRUCTION

[75] Inventors: Pierre C. Fazan; Brent Keeth, both of Boise, Id.

[73] Assignee: Micron Technology, Inc., Boise, Id.

[21] Appl. No.: 559,647

[22] Filed: Nov. 20, 1995

[51] Int. Cl.$^6$ .............................. H01L 21/70; H01L 27/00
[52] U.S. Cl. ............................................................ 438/397
[58] Field of Search ............................ 437/919, 60, 52, 437/47; 257/308

[56] References Cited

U.S. PATENT DOCUMENTS

| | | | |
|---|---|---|---|
| 5,071,781 | 12/1991 | Seo et al. | 437/47 |
| 5,223,729 | 6/1993 | Kudoh et al. | 257/296 |
| 5,290,726 | 3/1994 | Kim | 437/52 |

OTHER PUBLICATIONS

Morihara, Toshinori et al., "Disk–Shaped Stacked Capacitor Cell for 256 Mb Dynamic Random–Access Memory", Jpn. J. Appl. Phys., vol. 33 (1994) Pt. 1, No.8.

Watanabe, Hidehiro, et al., "Stacked Capacitor Cells for High–Density RAMs", IEDM '88, pp. 600–603.

S.H. Woo, et al., "Selective Etching Technology of in–situ P Doped Poly-Si (SEDOP) for High Density DRAM Capacitor", IEEE, 1994, pp. 25–26.

*Primary Examiner*—Jey Tsai
*Attorney, Agent, or Firm*—Wells, St. John, Roberts, Gregory & Matkin, P.S.

[57] ABSTRACT

A method of forming a capacitor includes, a) providing a series of alternating first and second layers of semiconductive material over a node location, a first of the first and second layers having an average conductivity enhancing dopant concentration of greater than about $5 \times 10^{19}$ ions/cm$^3$, a second of the first and second layers having an average conductivity enhancing dopant concentration from 0 ions/cm$^3$ to about $5 \times 10^{19}$ ions/cm$^3$, at least one of the first and second layers being selectively etchable relative to the other of the first and second layers; b) providing a contact opening through the first and second layers of semiconductive material to the node location; c) providing an electrically conductive within the contact opening; d) masking and etching the conductive layer and the series of alternating layers to form a first capacitor plate; e) etching the one of the first and second layers at a faster rate than the other of the first and second layers to define lateral projections of the other of the first and second layers relative to the one of the first and second layers, the electrically conductive layer being in ohmic electrical connection with the first and second layers and lateral projections thereof; the conductive layer, the first and second layers and lateral projections thereof comprising the first capacitor plate; f) providing a capacitor dielectric layer over the conductive layer and the lateral projections; and g) providing a second capacitor plate over the capacitor dielectric layer.

31 Claims, 6 Drawing Sheets

5,637,523

METHOD OF FORMING A CAPACITOR AND A CAPACITOR CONSTRUCTION

TECHNICAL FIELD

This invention relates generally to capacitor formation in semiconductor wafer processing, and to resultant capacitor constructions.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area.

The principal way of increasing cell capacitance is through cell structure techniques. Such techniques include three-dimensional cell capacitors, such as trenched or stacked capacitors. This invention concerns stacked capacitor cell constructions, including what are commonly known as crown or cylindrical container stacked capacitors.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a capacitor comprises the following steps:

providing a node location to which electrical connection to a first capacitor plate is to be made;

providing a series of alternating first and second layers of semiconductive material over the node location, a first of the first and second layers having an average conductivity enhancing dopant concentration of greater than about $5 \times 10^{19}$ ions/cm$^3$, a second of the first and second layers having an average conductivity enhancing dopant concentration from 0 ions/cm$^3$ to about $5 \times 10^{19}$ ions/cm$^3$, at least one of the first and second layers being selectively etchable relative to the other of the first and second layers;

providing a contact opening through the first and second layers of semiconductive material to the node location;

providing an electrically conductive layer over the series of alternating first and second layers and within the contact opening;

masking and etching the conductive layer and the series of alternating layers to form a first capacitor plate;

etching the one of the first and second layers at a faster rate than the other of the first and second layers to define lateral projections of the other of the first and second layers relative to the one of the first and second layers, the electrically conductive layer being in ohmic electrical connection with the first and second layers and lateral projections thereof; the conductive layer, the first and second layers and lateral projections thereof comprising the first capacitor plate;

providing a capacitor dielectric layer over the conductive layer and the lateral projections; and providing a second capacitor plate over the capacitor dielectric layer.

Figure 1:
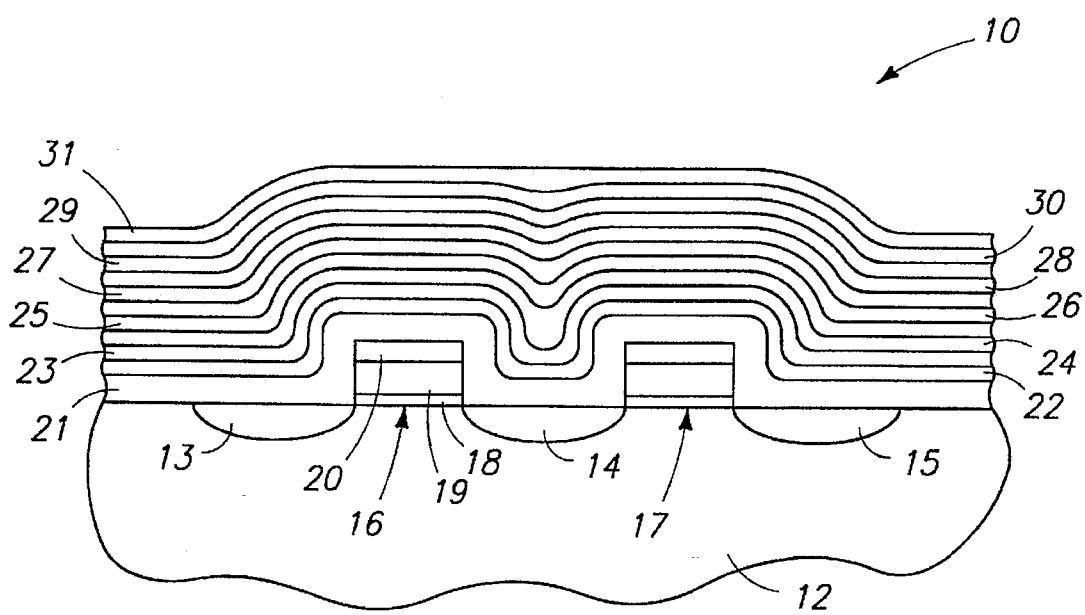
FIG. 1 is a diagrammatic sectional view of a semiconductor wafer fragment at one processing step in accordance with the invention.

Referring to FIG. 1, a semiconductor wafer fragment in process is indicated generally with reference numeral 10. Such comprises a bulk monocrystalline silicon substrate 12 having diffusion regions 13, 14, 15 provided therein. A pair of word lines 16 and 17 are provided as shown. Such comprise a gate oxide region 18, a conductive region 19, and an electrically insulative oxide or nitride cap 20. An encapsulating layer 21 of SiO$_2$, Si$_3$N$_4$ or a combination thereof is provided atop substrate 12 and word line construction 16 and 17. For purposes of the continuing discussion and in accordance with the described example, diffusion region 14 constitutes a node location to which electrical connection to a first capacitor plate is to be made.

A series of alternating first layers 22, 24, 26, 28 and 30 and second layers 23, 25, 27, 29 and 31 are provided outwardly or over node location 14. An example thickness for each of the first and second set of layers is 200 Angstroms to 1000 Angstroms. The alternating series of such first and second layers are provided with different conductivity enhancing dopant concentrations to render at least one set selectively etchable relative to the other set. For example, one or a first of the first layers 22, 24, 26, 28 and 30 or the second layers 23, 25, 27, 29 and 31 are provided to have a conductivity enhancing dopant concentration of greater than about $5 \times 10^{19}$ ions/cm$^3$. The other or a second of the first layer set or the second layer set is provided to have an average conductivity enhancing dopant concentration of from 0 ions/cm$^3$ to about $5 \times 10^{19}$ ions/cm$^3$. At least one of the first set of layers and the second set of layers is selectively etchable relative to the other of the first set of layers or the second set of layers. Preferably, the base semiconductive material of the collective layers 22–31 constitutes the same semiconductive material. The preferred material is silicon, such as amorphous silicon or polycrystalline silicon.

The different dopant concentration between the first set and second set of layers facilitates selective etching used in the process as described below. For example, an example wet etch chemistry for selectively etching heavily doped silicon (i.e., greater than $5 \times 10^{19}$ ions/cm$^3$) relative to lightly doped silicon (i.e., less than $5 \times 10^{19}$ ions/cm$^3$) includes a mixture of 0.7% HF, 50% to 54% HNO$_3$, 2.6% CH$_3$COOH, with the remainder being deionized water (percents are volume percent). The greater the difference between the dopings, the greater the selectivity. For example, the above chemistry when utilized with a totally undoped first set and a second set doping of $2 \times 10^{20}$ ions/cm$^3$ resulted in a selectivity of 120:1. The silicon dopant was phosphorus. Alternately, an example chemistry for selectively etching undoped silicon relative to doped silicon includes HF 0.53 volume percent, HNO$_3$ at 37.63 volume percent, CH$_3$COOH at 22.58 volume percent, NH$_4$F at 4.21 volume percent, with the remaining being deionized water at 35.05 volume percent. Where the lower doped layer is entirely undoped and the heavily doped layer has a dopant concentration of $2 \times 10^{20}$ ions/cm$^3$, a selectivity of greater than 3:1 etching of undoped to doped silicon is obtained.

Figure 2:
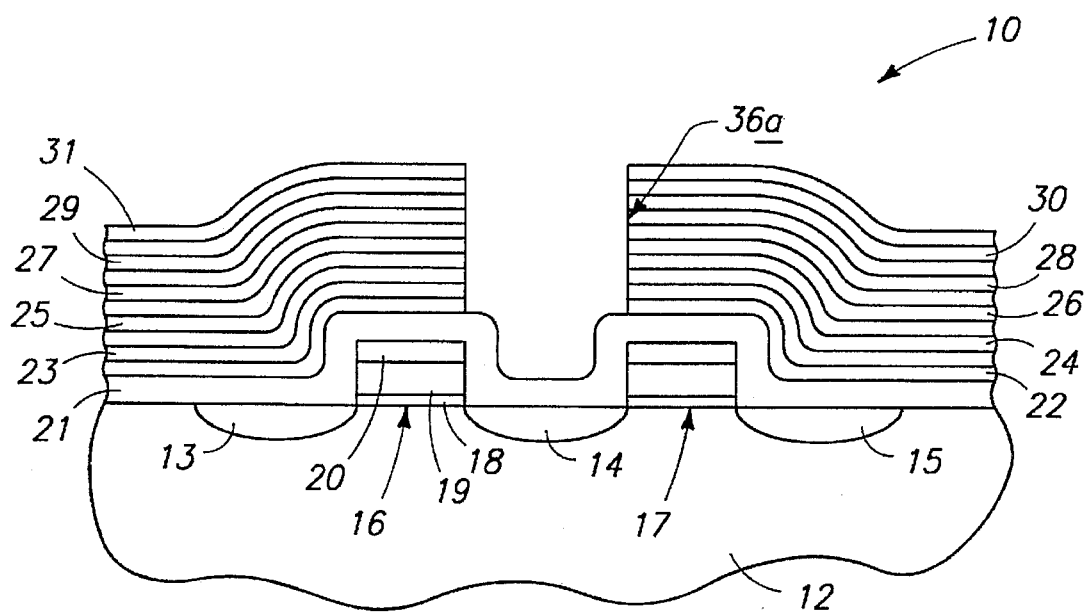
FIG. 2 is a view of the FIG. 1 wafer fragment at a processing step subsequent to that shown by FIG. 1.

Referring to FIG. 2, in a substantially non-selective manner relative to the first set of layers and second set of layers, a contact opening 36 is etched through the first and second sets of layers inwardly to node location 14. An example dry etch chemistry to etch contact 36 will include Cl$_2$ to result in an anisotropic etch.

Figure 3:
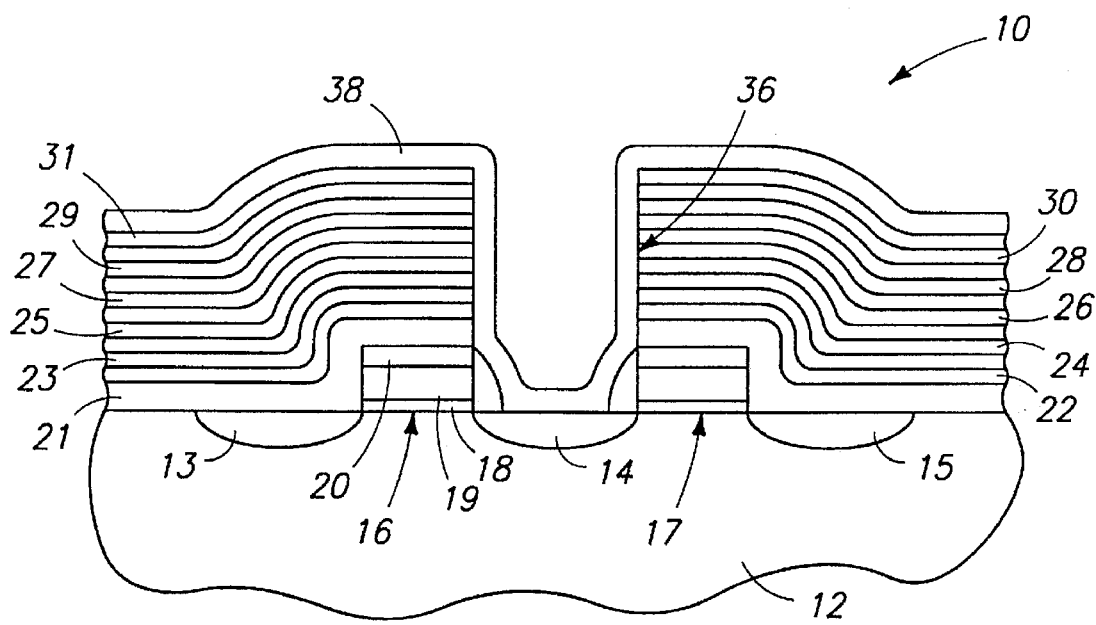
FIG. 3 is a view of the FIG. 1 wafer fragment at a processing step subsequent to that shown by FIG. 2.

Referring to FIG. 3, an electrically conductive layer 38 is provided over the series of alternating first and second layers and within contact opening 36. Most preferably, layer 38 is provided to a thickness which less than completely fills contact opening 36 to define a container-shaped construction. An example width for contact opening 36 is 0.2 to 0.6 micron, with an example thickness for layer 38 being from 200 Angstroms to 1000 Angstroms. A preferred material for layer 38 is conductively doped polysilicon having the same dopant and dopant concentration as first set of layers 22, 24, 26, 28 and 30.

Figure 4:
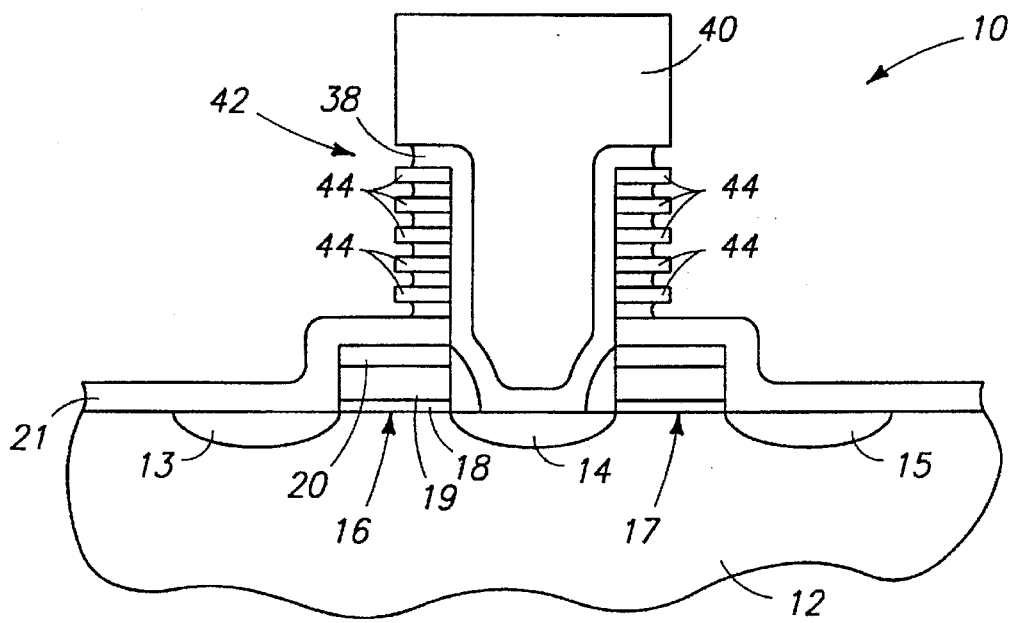
FIG. 4 is a view of the FIG. 1 wafer fragment at a processing step subsequent to that shown by FIG. 3.

Referring to FIG. 4, a layer of photoresist 40 is deposited and patterned as shown to provide a mask for the outline of a first capacitor plate. Subsequently, conductive layer 38 and the series of alternating layers 22–31 are etched to form a first capacitor plate construction 42. One of the first set of layers 22, 24, 26, 28 and 30 or the second set of layers 23, 25, 27, 29 and 31 is etched at a faster rate than the other set to define outer lateral projections. In this depicted embodiment, first set of layers 22, 24, 26, 28 and 30 are etched at a faster rate than the second set 23, 25, 27, 29 and 31 such that outer lateral projections 44 of the second set of layers are produced. Accordingly, conductive layer 38, remaining portions of first and second sets of layers 22–31 and projections 44 thereof, comprise first capacitor plate 42.

The steps of etching to form first capacitor plate 42 and etching to define outer lateral projections 44 can be conducted in the same essential etching step utilizing an appropriate chemistry which isotropically will etch the first set of layers 22, 24, 26, 28 and 30 faster than second set of layers 23, 25, 27, 29 and 31. Alternately, the steps of etching to form first capacitor plate 42 and etching to define outer lateral projections 44 can comprise different and discrete etching steps. Further, the second set might be etched selectively relative to the first set, or the dopant concentrations reversed relative to the first and second set of layers. In accordance with the above described embodiment, the etching of the first and second sets of layers to produce the projections and the etching to form the first capacitor plate occur either in the same etching step, or the projection etch occurs after the first capacitor plate etch.

Figure 5:
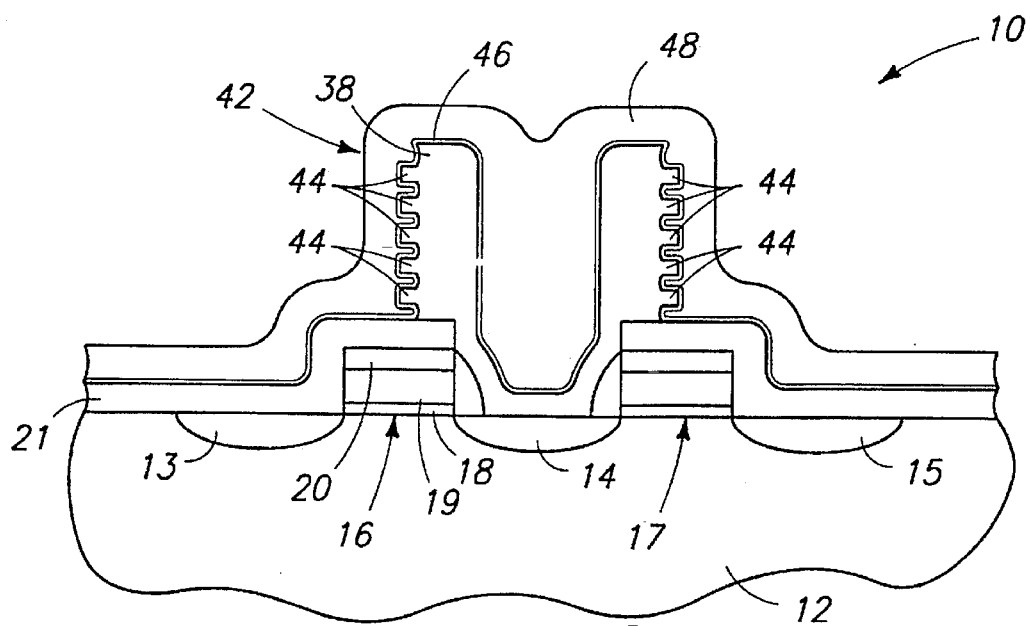
FIG. 5 is a view of the FIG. 1 wafer fragment at a processing step subsequent to that shown by FIG. 4.

Referring to FIG. 5, photoresist layer 40 has been stripped and a capacitor dielectric layer 46 provided over conductive layer 38 and outer lateral projections 44. Subsequently, a second capacitor plate layer 48 is provided over capacitor dielectric layer 46. The dopants from the heavily diffused regions of the first or storage node capacitor plate ultimately diffuse into the undoped or lightly doped layers. Alternately, a separate doping step by ion implantation of gas diffusion subsequent could be provided.

Figure 6:
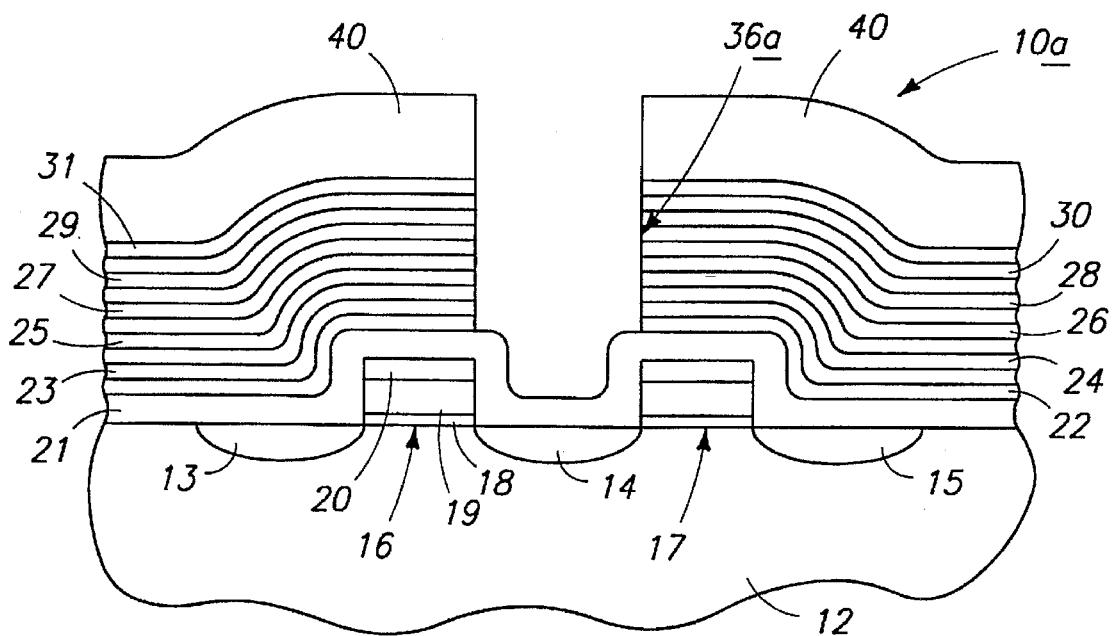
FIG. 6 is a diagrammatic sectional view of an alternate embodiment semiconductor wafer fragment at a processing step in accordance with the invention.

An alternate embodiment is described next with reference to FIGS. 6–10. Like numerals from the first described embodiment are utilized where appropriate with differences of any significance being indicated with different numerals or the suffix "a". FIG. 6 illustrates a wafer fragment 10a having a contact opening 36a etched through the first and second layer sets, stopping on outer oxide layer 21. An example etch chemistry will include SF$_6$ and Cl$_2$ that will etch contact 36 anisotropically, creating the vertical walls shown in FIG. 2.

Figure 7:
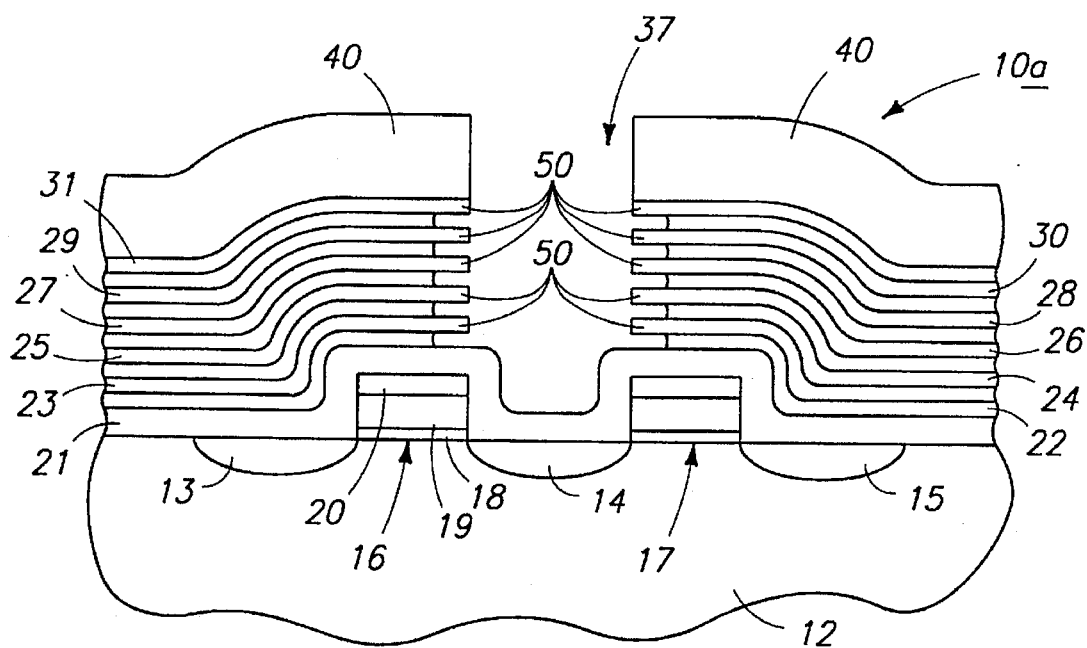
FIG. 7 is a view of the FIG. 6 wafer fragment at a processing step subsequent to that shown by FIG. 6.

Referring to FIG. 7, one of the first and second sets of layers is etched at a faster rate than the other within contact opening 36a to define inner lateral projections 50. In accordance with the above described embodiment, separate etches can be utilized to first produce the FIG. 6 and then the FIG. 7 construction. Alternately, the etch to produce contact opening 36a and effectively projections 50 of FIG. 7 could be conducted in a common or single etching step. Regardless, the result is formation of a modified roughened or rippled contact opening 37.

Figure 8:
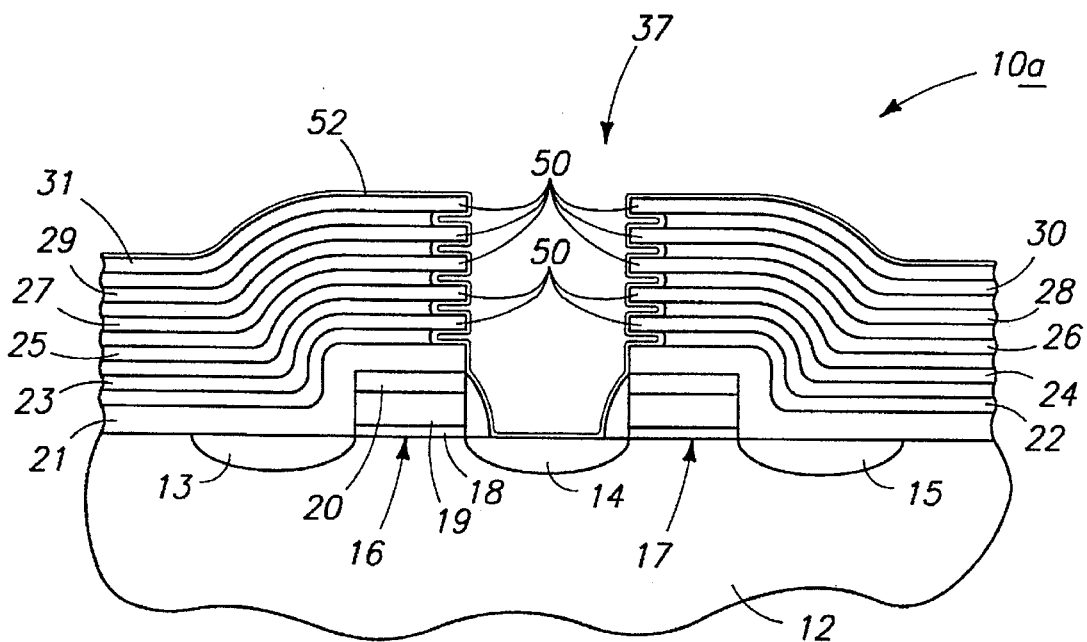
FIG. 8 is a view of the FIG. 6 wafer fragment at a processing step subsequent to that shown by FIG. 7.

Referring to FIG. 8, an etch of oxide layer 21 selectively relative to silicon of layers 22–31 and node location 14 is conducted to the node location to substantially complete formation of contact opening 37. An example etch chemistry would include CF$_4$ or C$_2$F$_6$. Subsequently, an electrically conductive layer 52 is provided over the series of alternating first and second sets of layers and within contact opening 37 over inner lateral projections 50. Preferably and as shown, electrically conductive layer 52 is provided to less than completely fill contact opening 37 to define a container-like construction. A preferred material for layer 52 is conductively doped polysilicon having the same dopant concentrations as layers 22, 24, 26, 28 and 30 in this described example.

Figure 9:
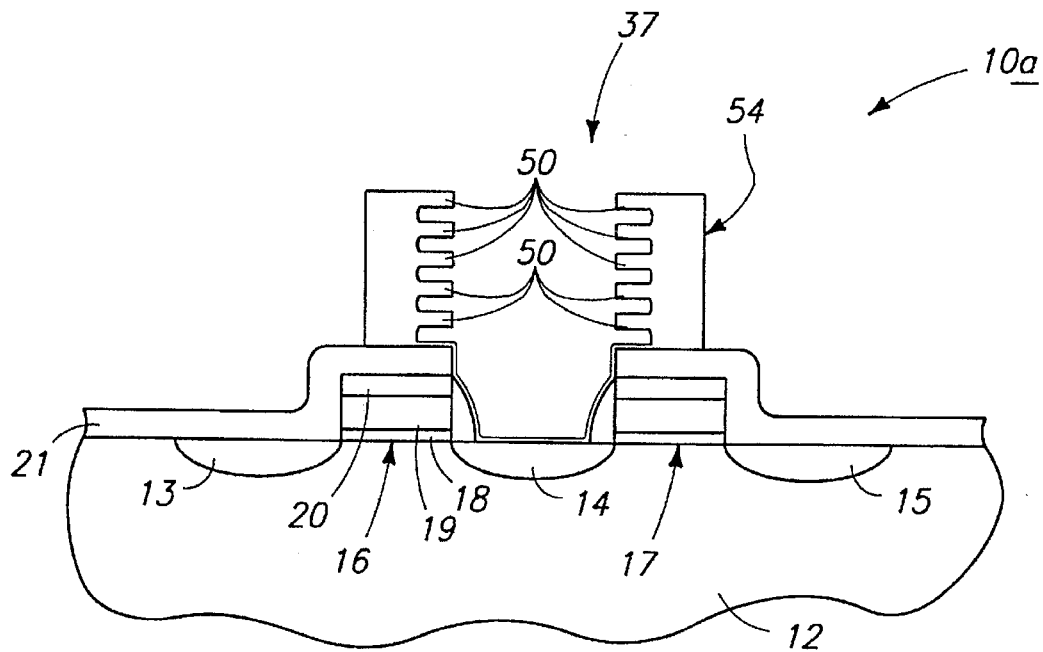
FIG. 9 is a view of the FIG. 6 wafer fragment at a processing step subsequent to that shown by FIG. 8.
Figure 10:
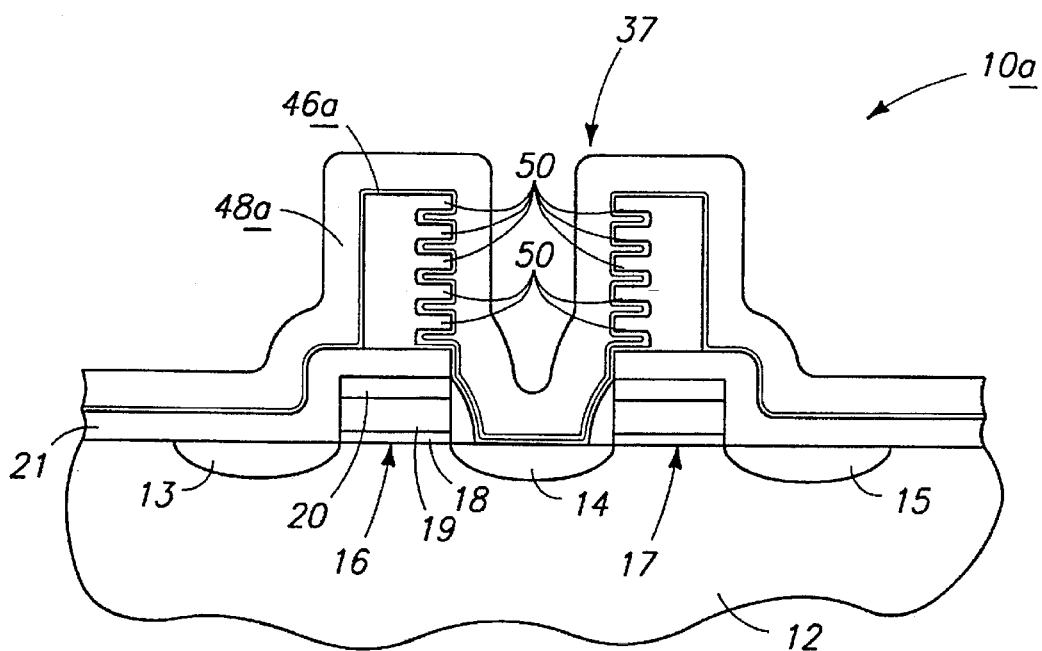
FIG. 10 is a view of the FIG. 6 wafer fragment at a processing step subsequent to that shown by FIG. 9.

Referring to FIG. 9, a photoresist mask (not shown) is provided and layers 52 and the first and second sets are then etched with no selectivity relative to one another to define the outline of a first capacitor plate 54. Subsequently, the capacitor dielectric layer 46a and second capacitor plate layer 48a are provided to essentially complete the capacitor construction (FIG. 10).

Figure 11:
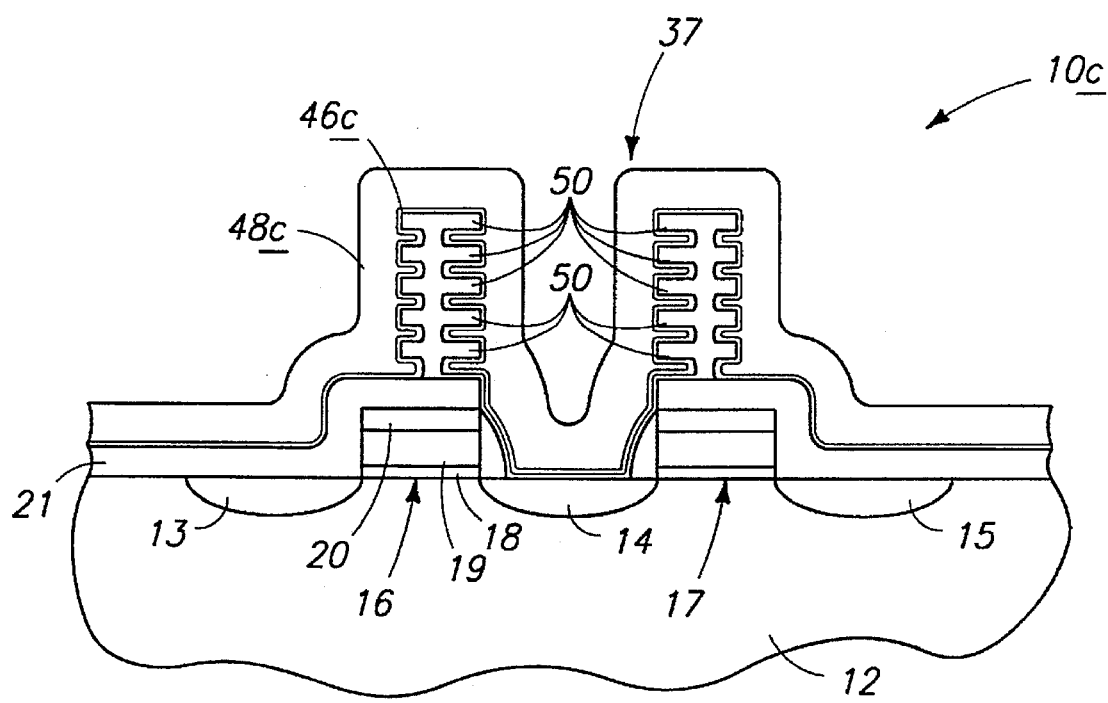
FIG. 11 is a diagrammatic sectional view of another alternate embodiment semiconductor wafer fragment at a processing step in accordance with the invention.

FIG. 11 illustrates an effective alternate construction whereby a combination of the above two described preferred embodiments are combined to maximize available surface area for the storage node portion of a capacitor. Like numerals from the first described embodiment are utilized where appropriate, with differences being indicated with different numerals, or with the suffix "c". To produce the wafer fragment construction 10c, the second described process is performed up until the etch to define the first capacitor plate. Then with the resist in place, a wet polysilicon etch is used to create the desired outer first capacitor plate outline. Such etch can be conducted initially to provide a substantial 1:1 selectivity of doped relative to undoped semiconductive material, followed by a selective etch to provide the illustrated projections. Alternately, such etch to form the first capacitor plate can be conducted with a highly selective etch to simultaneously produce the first capacitor plate outline and projections or corrugations.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a capacitor comprising the following steps:

providing a node location to which electrical connection to a first capacitor plate is to be made;

providing a series of alternating first and second layers of semiconductive material over the node location, a first of the first and second layers having an average conductivity enhancing dopant concentration of greater than about $5 \times 10^{19}$ ions/cm$^3$, a second of the first and second layers having an average conductivity enhancing dopant concentration from 0 ions/cm$^3$ to about $5 \times 10^{19}$ ions/cm$^3$, at least one of the first and second layers being selectively etchable relative to the other of the first and second layers;

providing a contact opening through the first and second layers of semiconductive material to the node location;

providing an electrically conductive layer over the series of alternating first and second layers and within the contact opening;

masking and etching the conductive layer and the series of alternating layers to form a first capacitor plate;

etching the one of the first and second layers at a faster rate than the other of the first and second layers to define lateral projections of the other of the first and second layers relative to the one of the first and second layers, the electrically conductive layer being in ohmic electrical connection with the first and second layers and lateral projections thereof; the conductive layer, the first and second layers and lateral projections thereof comprising the first capacitor plate;

providing a capacitor dielectric layer over the conductive layer and the lateral projections; and providing a second capacitor plate over the capacitor dielectric layer.

2. The method of forming a capacitor of claim 1 wherein the first layers are selectively etchable relative to the second layers.

3. The method of forming a capacitor of claim 1 wherein the electrically conductive layer is provided to less than completely fill the contact opening to define a container construction.

4. The method of forming a capacitor of claim 1 wherein the step of etching the first and second layers to produce the projections occurs before the step of etching to form the first capacitor plate.

5. The method of forming a capacitor of claim 1 wherein the etching of the first and second layers to produce the projections and the etching to form the first capacitor plate occur in the same etching step.

6. The method of forming a capacitor of claim 1 wherein the step of etching the first and second layers to produce the projections occurs after the step of etching to form the first capacitor plate.

7. The method of forming a capacitor of claim 1 wherein, the electrically conductive layer is provided to less than completely fill the contact opening to define a container construction; and the step of etching the first and second layers to produce the projections is conducted in two distinct steps to form first and second pairs of radially opposed projections which comprise the container construction.

8. The method of forming a capacitor of claim 1 wherein the first and second layers comprise the same base semiconductive material.

9. The method of forming a capacitor of claim 1 wherein the conductivity doping of the first of the first and second layers is greater than about $2 \times 10^{20}$ ions/cm$^3$.

10. A method of forming a capacitor comprising the following steps:

providing a node location to which electrical connection to a first capacitor plate is to be made;

providing a series of alternating first and second layers of semiconductive material over the node location, a first of the first and second layers having an average conductivity enhancing dopant concentration of greater than about $5 \times 10^{19}$ ions/cm$^3$, a second of the first and second layers having an average conductivity enhancing dopant concentration from 0 ions/cm$^3$ to about $5 \times 10^{19}$ ions/cm$^3$, at least one of the first and second layers being selectively etchable relative to the other of the first and second layers;

in a substantially non-selective manner relative to the first and second layers of semiconductive material, etching a contact opening through the first and second layers to the node location;

providing an electrically conductive layer over the series of alternating first and second layers and within the contact opening;

masking and etching the conductive layer and the series of alternating layers to form a first capacitor plate;

after providing the electrically conductive layer, etching the one of the first and second layers at a faster rate than the other of the first and second layers to define outer lateral projections of the other of the first and second layers relative to the one of the first and second layers, the electrically conductive layer being in ohmic electrical connection with the first and second layers and outer lateral projections thereof; the conductive layer, the first and second layers and outer lateral projections thereof comprising the first capacitor plate;

providing a capacitor dielectric layer over the conductive layer and the outer lateral projections; and providing a second capacitor plate over the capacitor dielectric layer.

11. The method of forming a capacitor of claim 10 wherein the steps of etching to form the first capacitor plate and etching to define the outer lateral projections comprise the same etching step.

12. The method of forming a capacitor of claim 10 wherein the steps of etching to form the first capacitor plate and etching to define the outer lateral projections comprise different etching steps.

13. The method of forming a capacitor of claim 10 wherein the first layers are selectively etchable relative to the second layers.

14. The method of forming a capacitor of claim 10 wherein the electrically conductive layer is provided to less than completely fill the contact opening to define a container construction.

15. The method of forming a capacitor of claim 10 wherein the first and second layers comprise the same base semiconductive material.

16. A method of forming a capacitor comprising the following steps:

providing a node location to which electrical connection to a first capacitor plate is to be made;

providing a series of alternating first and second layers of semiconductive material over the node location, a first of the first and second layers having an average conductivity enhancing dopant concentration of greater than about $5 \times 10^{19}$ ions/cm$^3$, a second of the first and second layers having an average conductivity enhancing dopant concentration from 0 ions/cm$^3$ to about $5 \times 10^{19}$ ions/cm$^3$, at least one of the first and second layers being selectively etchable relative to the other of the first and second layers;

etching a contact opening through the first and second layers of semiconductive material to the node location;

etching the one of the first and second layers at a faster rate than the other of the first and second layers within the contact opening to define inner lateral projections of the other of the first and second layers relative to the one of the first and second layers;

after the etching to define the inner lateral projections, providing an electrically conductive layer over the series of alternating first and second layers and within the contact opening over the inner lateral projections to less than completely fill the contact opening and define a container construction;

masking and etching the conductive layer and the series of alternating layers to form a first capacitor plate;

providing a capacitor dielectric layer over the conductive layer and the inner lateral projections; and providing a second capacitor plate over the capacitor dielectric layer.

17. The method of forming a capacitor of claim 16 wherein the steps of etching the contact opening and etching to define the inner lateral projections comprise the same etching step.

18. The method of forming a capacitor of claim 16 wherein the steps of etching the contact opening and etching to define the inner lateral projections comprise different etching steps.

19. The method of forming a capacitor of claim 16 wherein the first layers are selectively etchable relative to the second layers.

20. The method of forming a capacitor of claim 16 wherein the first and second layers comprise the same base semiconductive material.

21. A method of forming a capacitor comprising the following steps:

providing a node location to which electrical connection to a first capacitor plate is to be made;

providing a series of alternating first and second layers of semiconductive material over the node location, a first of the first and second layers having an average conductivity enhancing dopant concentration of greater than about $5 \times 10^{19}$ ions/cm$^3$, a second of the first and second layers having an average conductivity enhancing dopant concentration from 0 ions/cm$^3$ to about $5 \times 10^{19}$ ions/cm$^3$, at least one of the first and second layers being selectively etchable relative to the other of the first and second layers;

etching a contact opening through the first and second layers to the node location;

etching the one of the first and second layers at a faster rate than the other of the first and second layers within the contact opening to define inner lateral projections of the other of the first and second layers relative to the one of the first and second layers;

after the etching to define the inner lateral projections, providing an electrically conductive layer over the series of alternating first and second layers and within the contact opening over the inner lateral projections to less than completely fill the contact opening and define a container construction;

masking and etching the conductive layer and the series of alternating layers to form a first capacitor plate;

after providing the conductive layer, etching the one of the first and second layers at a faster rate than the other of the first and second layers to define outer lateral projections of the other of the first and second layers relative to the one of the first and second layers;

providing a capacitor dielectric layer over the conductive layer and the inner and outer lateral projections; and providing a second capacitor plate over the capacitor dielectric layer.

22. The method of forming a capacitor of claim 21 wherein the steps of etching the contact opening and etching to define the inner lateral projections comprise the same etching step.

23. The method of forming a capacitor of claim 21 wherein the steps of etching the contact opening and etching to define the inner lateral projections comprise different etching steps.

24. The method of forming a capacitor of claim 21 wherein the steps of etching to form the first capacitor plate and etching to define the outer lateral projections comprise the same etching step.

25. The method of forming a capacitor of claim 21 wherein the steps of etching to form the first capacitor plate and etching to define the outer lateral projections comprise different etching steps.

26. The method of forming a capacitor of claim 21 wherein, the steps of etching the contact opening and etching to define the inner lateral projections comprise the same etching step; and the steps of etching to form the first capacitor plate and etching to define the outer lateral projections comprise the same etching step.

27. The method of forming a capacitor of claim 21 wherein, the steps of etching the contact opening and etching to define the inner lateral projections comprise the same etching step; and the steps of etching to form the first capacitor plate and etching to define the outer lateral projections comprise different etching steps.

28. The method of forming a capacitor of claim 21 wherein, the steps of etching the contact opening and etching to define the inner lateral projections comprise different etching steps; and the steps of etching to form the first capacitor plate and etching to define the outer lateral projections comprise the same etching step.

29. The method of forming a capacitor of claim 21 wherein, the steps of etching the contact opening and etching to define the inner lateral projections comprise different etching steps; and the steps of etching to form the first capacitor plate and etching to define the outer lateral projections comprise different etching steps.

30. The method of forming a capacitor of claim 21 wherein the first layers are selectively etchable relative to the second layers.

31. The method of forming a capacitor of claim 21 wherein the first and second layers comprise the same base semiconductive material.

* * * * *